United States Patent [19]

Liu et al.

[11] Patent Number: 4,516,852
[45] Date of Patent: May 14, 1985

[54] METHOD AND APPARATUS FOR MEASURING INTENSITY VARIATION IN A LIGHT SOURCE

[75] Inventors: Raymond C. Liu; David A. Markle, both of Norwalk, Conn.

[73] Assignee: The Perkin-Elmer Corp., Norwalk, Conn.

[21] Appl. No.: 568,764

[22] Filed: Jan. 6, 1984

Related U.S. Application Data

[63] Continuation of Ser. No. 292,466, Aug. 13, 1981.

[51] Int. Cl.³ .............................................. G03B 27/58
[52] U.S. Cl. .................................. 356/121; 356/218; 356/230
[58] Field of Search ............... 356/121, 123, 394, 218, 356/229, 230

[56] References Cited

U.S. PATENT DOCUMENTS

| | | | |
|---|---|---|---|
| 3,282,149 | 11/1966 | Shaw et al. | 250/205 |
| 3,542,479 | 11/1970 | Sibalis | 250/205 |
| 3,617,744 | 11/1971 | Irish | 356/394 |
| 3,646,331 | 2/1972 | Lord | 356/319 |
| 3,698,815 | 10/1972 | Thomas | 356/121 |
| 3,706,498 | 12/1972 | Peacher | 356/218 |
| 3,734,621 | 5/1973 | Moody et al. | 356/325 |
| 3,849,004 | 11/1974 | Cofek | 356/431 |
| 3,867,036 | 2/1975 | Detwiler et al. | 356/218 |
| 3,894,804 | 7/1975 | Detwiler et al. | 356/121 |
| 3,909,602 | 9/1975 | Micka | 356/394 |
| 3,917,402 | 11/1975 | Ohta | 356/394 |
| 4,068,947 | 1/1978 | Buckley et al. | 355/72 |
| 4,358,732 | 11/1982 | Johnston et al. | 356/394 |

*Primary Examiner*—R. A. Rosenberger
*Attorney, Agent, or Firm*—Thomas P. Murphy; Edwin T. Grimes; F. L. Masselle

[57] ABSTRACT

This invention relates to a method and apparatus for measuring the exposure variation in the cross scan direction in an optical projector and scanning apparatus of the type that uses an annular aperture or slit. This measuring is achieved by measuring the light intensity from point to point along the arcuate illuminated area. Where the illuminated area is tapered so as to accommodate a pivoting carriage the system of this invention processes the intensity signal to yield a uniformity signal that only indicates departures from the ideal.

8 Claims, 9 Drawing Figures

KNURLED SCREW

ASSEMBLED OPTICAL HEAD 79

METHOD AND APPARATUS FOR MEASURING INTENSITY VARIATION IN A LIGHT SOURCE

This application is a continuation Ser. No. 292,466, filed Aug. 13, 1981.

BACKGROUND OF THE INVENTION

This invention relates generally to measuring light intensity uniformity in apparatus for exposing a light-sensitive object to a succession of light images in closely controlled positions. This type of apparatus finds particular use in the manufacture of integrated circuits. In one method of manufacturing such integrated circuits, an oxidized wafer of silicon is coated with a photo-resist material. The wafer may be of such dimensions that, after processing, it can be cut along rows and columns into a large number of chips. When such coated wafers are exposed to light, the photo-resist material polymerizes into a tenacious coating, whereas the unexposed portions of the layer are readily removable, as for example, by means of a solvent or developer. By means of a "mask" or "master", which is opaque except for a pattern of transparent lines and areas therein through which light can pass, the wafer with photo-resist coating is exposed to light in a pattern conforming to elements of a circuit to produce a photographic reverse thereof. The mask typically bears a multiplicity of the same pattern arranged in rows and columns. An image of the mask may be projected by image forming means onto the surface of the wafer as in projection printing. An apparatus for such projection printing is shown and described in U.S. Pat. No. 4,068,947. In this patent, an optical apparatus is shown and described wherein a wafer may be exposed to the image of a mask through use of a pivotal carriage. In such an apparatus, it is important to regulate the light intensity uniformity because the fidelity of geometries produced in the photo-resist depend on it. The slit through which the light passes must be properly tapered in accordance with the relative distance from the pivot axis of the carriage and different positions along the slit. As a result of this taper a light detector scanned along the slit would ideally see a linear variation of intensity as it traversed from one end of the slit to the other. For checking the variation from this ideal it is advantageous to eliminate the linear variation from the intensity trace and provide a uniformity reading by an analogue or digital panel meter.

SUMMARY OF THE INVENTION

A system is disclosed for directly measuring variations in the illumination uniformity of a ring field projection system. In the special case of a ring field system and pivoting scanning system combination the linear variation in intensity produced by a tapered slit in the illumination system can be removed from the uniformity measurement so that only departures from the ideal are indicated.

DETAILED DESCRIPTION OF THE PREFERRED EMBODIMENT

Figure 2:
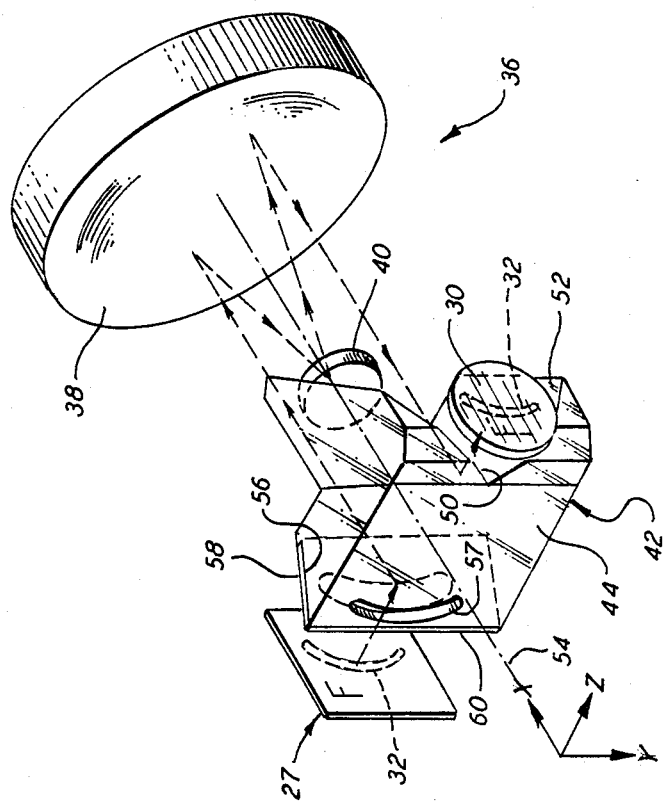
FIG. 2 is an enlarged, isometric view of the optical system shown within the carriage in FIG. 1.
Figure 1:
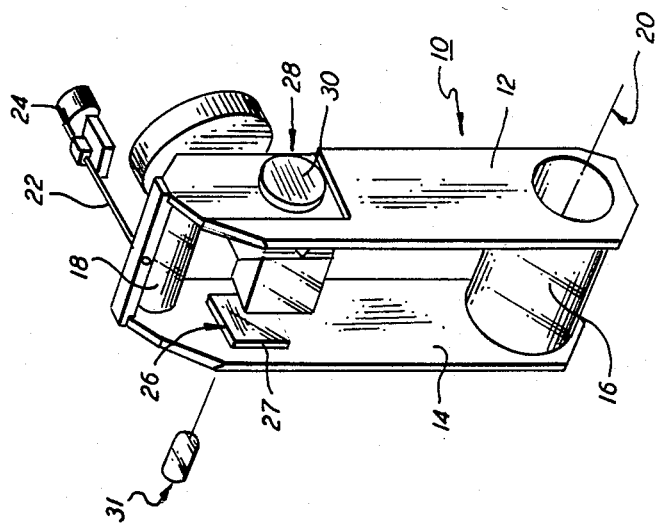
FIG. 1 is an isometric view of a carriage of an optical projection and scanning apparatus.

In FIGS. 1 and 2 of the drawing, a portion of the optical projection and scanning apparatus shown and described in U.S. Pat. No. 4,068,947 is shown. The instant invention is inherently involved with the apparatus shown and described in said U.S. Pat. No. 4,068,947 and for a full understanding of the instant invention reviewing the disclosure in that patent is recommended. Referring now to FIGS. 1 and 2, a carriage is shown generally at 10 and includes two parallel metallic side plates 12 and 14 held together by means of glass cylinders 16 and 18. The carriage 10 is mounted for arcuate rotation about the pivotal axis indicated at 20 which is located on or near the axis of the cylinder 16. The rotation is effected by means of the push rod 22 which connects to a drive mechanism 24. The side plate 14 includes a mask stage 26 supporting a mask 27 therein and the side plate 12 has a wafer stage 28 shown with a wafer 30 supported therein. The mask 27 is typically a glass plate with a partly opaque and partly transparent pattern laid down thereon. The mask stage 26 and wafer stage 28 are independently movable in finely controlled increments with respect to the carriage by means not shown. The wafers 30 are insertable into and removable from the wafer stage 28 by any convenient means. The masks 27 are similarly insertable into and removable from the mask stage 26. The mask 27 in the mask stage 26 is illuminated by a light source shown generally at 31, which is shown and described in detail in FIG. 3, that directs light through the mask 27.

The mask 27, when illuminated by light directed from the light source 31 will have an arcuate slit shaped image 32 projected therethrough and onto the surface of the wafer 30 at 32' through an optical system 36. The upper portion of the slit image 32 is caused to be wider than the lower portion because of the arcuate travel of the carriage 10. The components of the optical system 36 include a primary concave mirror 38, a secondary convex mirror 40 and a mirror array 42. The mirrors 38 and 40 are concentric or nearly so and the secondary mirror 40 is given a radius of curvature slightly greater than one-half the radius of the curvature of mirror 38, so as to achieve high quality imagery over an extra-axial zone which is caused to coincide with the illuminted slit-shaped image 32. The array 42 may be made from three blocks of glass 44, 46 and 48 suitably shaped and assembled. Details of this array 42 may be obtained by reference to the aforementioned U.S. Pat. No. 4,068,947. Light from the mask 27 is reflected into the primary mirror 38 whence it is reflected to the secondary mirror 40, back to the primary mirror 38 and thence one more to the array 42.

Figure 3:
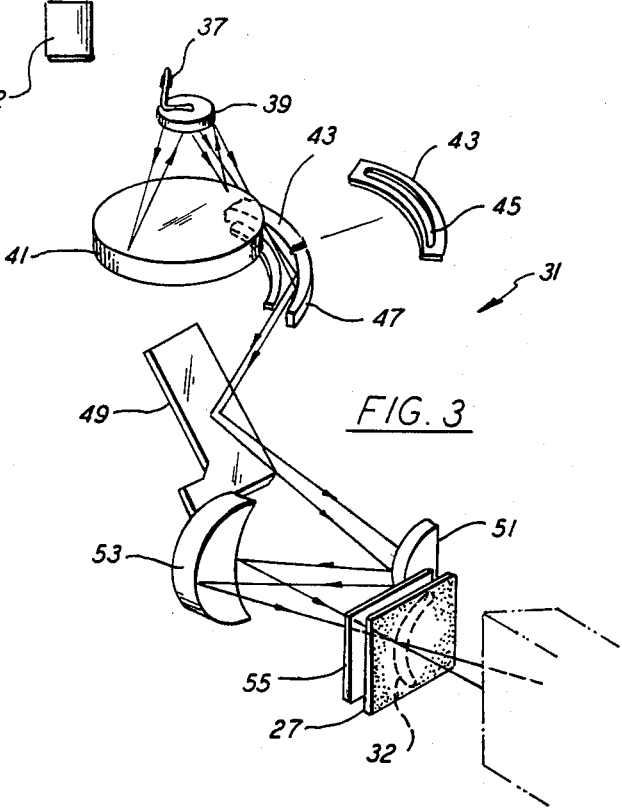
FIG. 3 is a perspective view of the light source shown in FIG. 1.

Referring now to FIG. 3 the light source 31 that creates the slit image 32 on the mask 27 is shown in detail. The light source is an optical system which includes a mercury lamp 37 that addresses a secondary mirror 39 which is spaced to a primary mirror 41. Adjacent and slightly below the primary mirror 41 is a plate 43 having an arcuate slit 45 therein. Next to and below the plate 43 is a toroidal mirror 47. The balance of the optical system 31 includes a first flat mirror 49, a second flat mirror 51, a relay mirror 53, and an actinic filter 55 that addresses the mask 27. As can be seen by the arrows in FIG. 3, light from the mercury lamp 37 passes through the lens 39 and is directed to the primary mirror 41. The light is reflected from the primary mirror back to the opposite half of lens 39 which is coated so as to reflect the light to the plate 43. A portion of the light passes through the slit 45 onto the toroidal mirror 47 from where it is reflected to the first flat mirror 49, the second flat mirror 51, the relay mirror 53, and through the filter 55 to create the slit image 32 on the mask 27.

Figure 4:
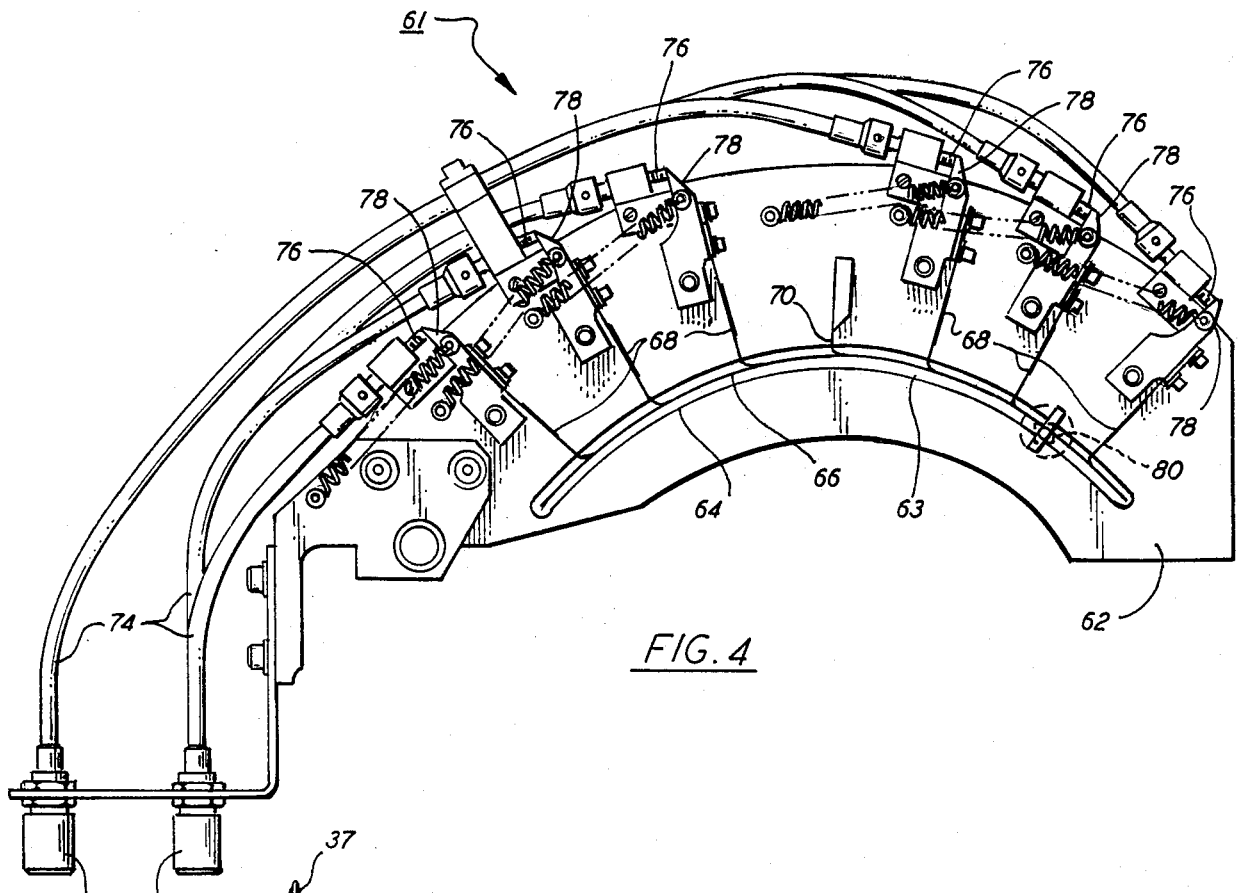
FIG. 4 is elevational, cross sectional view of a slit adjusting device.

Referring now to FIG. 4, a compliant member is shown at 61 having a slit 63 therein and suitable components whereby the width of the slit may be adjusted along its entire arcuate length. This compliant member 61 consists of a plate 62 containing the semi-circular slit 61 of which one edge 64 if fixed to define one edge of the slit shape. A deformable band 66 is used to define the other edge of the slit 61 shape. This deformable band 66 is supported by six movable flexures 68 and one fixed flexure 70. By means of knobs 72 and flexible cables 74 an operator is able to turn adjustable screws 76 that are operative to displace pivoting levers 78 which in turn actuate the adjustable flexures 68 thus forming the band 66 to its desired configuration. By turning the knobs 72 an operator can form the band 66 in such a way as to permit a desired amount of light or energy per unit slit length, to pass through the slit 61, even if the lamp 37 supplying the light, or the intervening optics, is non-uniform or imperfectly aligned. This compliant member 61 may be placed at the location of the plate 43 for the purposes of matching the slit 45 required for the lamp 37 as is explained hereinafter.

Figure 5:
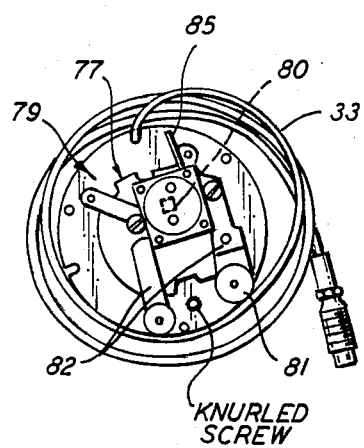
FIG. 5 is a plan view of an optical transducer that is used in the instant invention.

In order to determine the energy per unit length passing through the slit 61 when the plate 43 is replaced by the compliant member 61, an optical head 77 is mounted on a ring 79 and consists of a detector 80 and a position sensing potentiometer 81 connected to a movable parallel linkage assembly 82, as shown in FIG. 5. The optical head 77 may be placed at the wafer stage 28 instead of at wafer 30. The shaft of the potentiometer 81 is mechanically attached to the movable linkage arm assembly 82 so that as the detector 80 is positioned, the potentiometer shaft rotates to provide a resistance value and a resulting voltage that corresponds to the angular position of the photo-detector 80 relative to the midpoint of the slit 63. A handle 85 is provided to selectively move the linkage arm assembly 82 so that the optical head 77 traverses along the slit 63 as indicated in FIG. 4. A lead 83 is provided to convey the signal generated by the detector 80.

Figure 6:
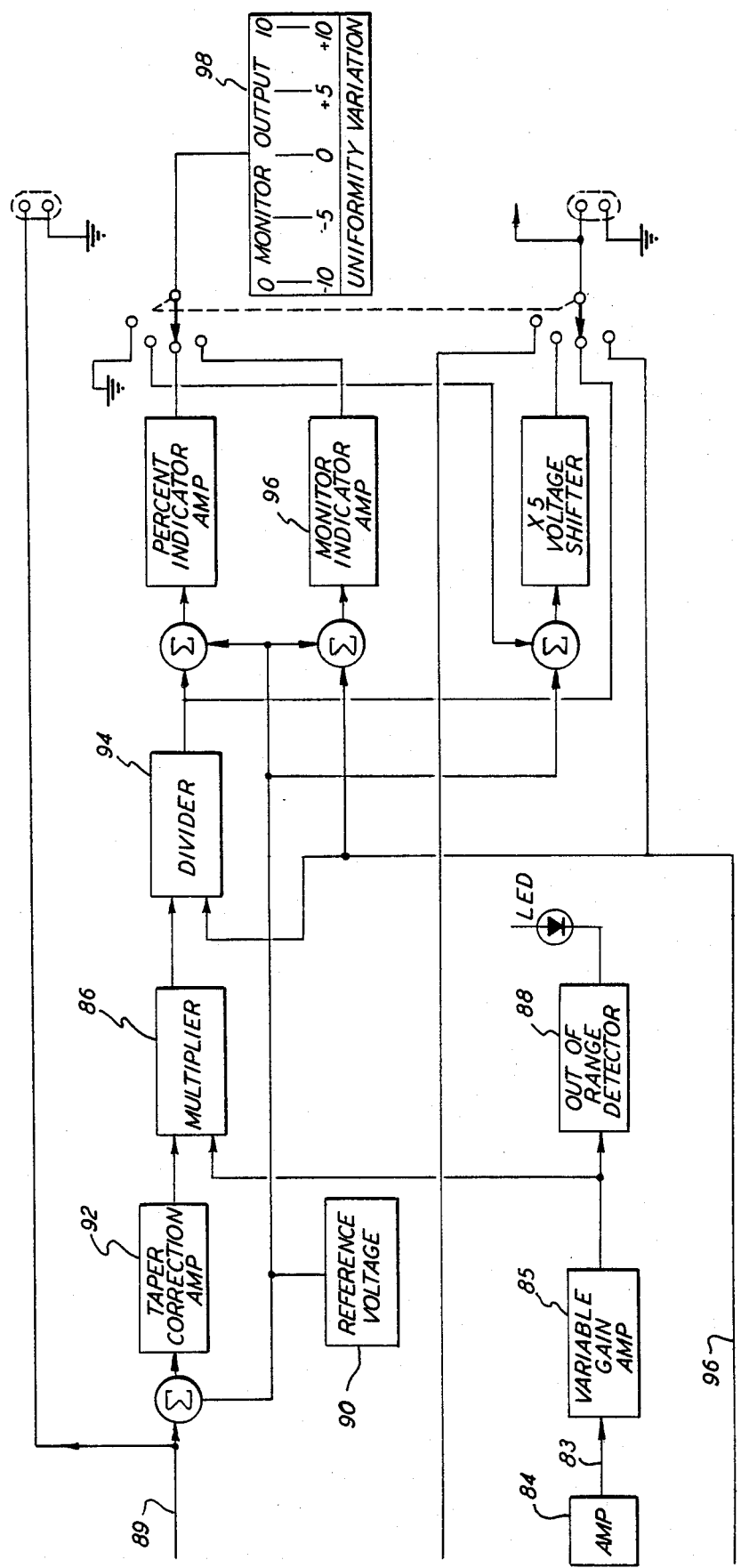
FIG. 6 is a block diagram of a uniformity variation indicator.

Referring now to FIGS. 6 and 7 the lead 33 is connected to the output of the detector 80. This lead 83 is connected to a first amplifier 84 and then to a variable gain amplifier 85 which in turn is connected to one input terminal of a multiplier 86 and to an out of range detector 88. Another lead 89 is connected to the potentiometer 81 and, along with a reference voltage source 90, is connected to a taper correction amplifier 92 which in turn is connected to the other input of the multiplier 86. The output of the multiplier 86 is connected to one of two inputs of a divider 94, the other input being connected to a monitor intensity signal 96, the latter signal being indicative of the intensity of the light being measured.

Figure 7A:
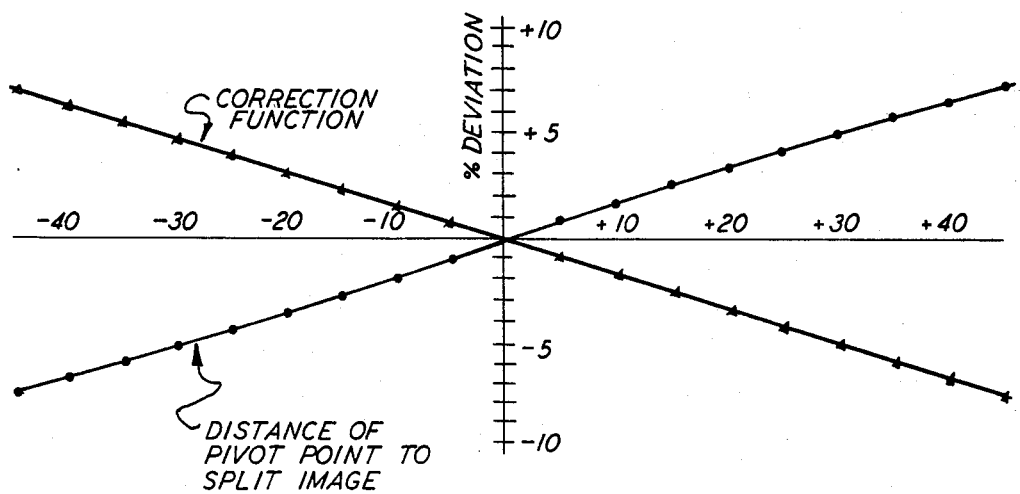
FIGS. 7a, 7b and 7c are diagrams showing various plots involved in the instant invention.
Figure 7C:
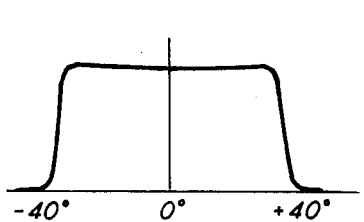
Figure 7B:
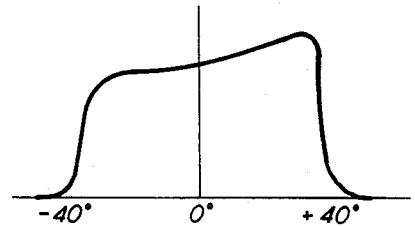

The output of the variable gain amplifier 85, which of course is directly proportional to the output of the photo-detector 80, when plotted would give a trace shown in FIG. 7b. The abscissa represents the position of the photo-detector 80 relative to the midpoint of the slit 63 and the ordinate represents the intensity of light received by the photo-detector 80. The trace exhibits a tilt of approximately 15% within the ±40 degree angle, the tilt resulting from the taper in the slit as seen by detector 80 looking through a narrow slit as it is scanned by the parallel linkage 82 along the slit image. In the carriage 10 shown in FIG. 1, the distance from the pivot axis 20 to the slit image 32 area is approximately 20 inches and the parallel linkage causes the optical head 77 to trace an arc of a 2.35 inch radius over a 90° arc. This combination occasions the 15° tilt at the top of the trace shown in FIG. 7b. Signals representative of this trace are supplied to one input of the multiplier 86 as seen in FIG. 6. The gain of the variable gain amplifier 85 is adjusted so that the output of the divider 94 is at a predetermined level of the center of the meter 98 when the detector is at the center of the slit. Assuming that the light passing through the slit 63 is uniform along the entire arcuate length of the slit, the required tapering of the light illumination is essentially a linear function. If the detector signals are multiplied by a complimentary function of opposite tilt at each detector position, as indicated in FIG. 7a, the result will be a horizontal trace. The taper correction amplifier 92 provides the signal of complimentary function. This signal is supplied to one terminal of the multiplier 86 and signals representative of the trace are supplied to the other terminal. These two inputs are multiplied and the output from the multiplier 86 assumes the configuration shown in FIG. 7c and is fed to one input of the divider 94. Since the output of the multiplier 86 will vary with change in lamp intensity, such as will occur with line voltage variation, the divider 94 is added for computing the ratio of the multiplier signal against the monitor intensity 96 signal to minimize output fluctuations. To indicate percent variation of uniformity, the output voltage of the divider 94 is adjusted manually by the variable gain amplifier and this voltage is then subtracted by the DC reference voltage supplied by the source 90 so that the indicator reading at the center of the meter becomes 0. With the system shown in FIG. 6 fully adjusted, one may then adjust the condenser system output using the compliant member 61 shown in FIG. 4. The width of the slit 63 of the compliant member 61 would be adjusted through the movable flexures 68 so that light illumination is uniform along the entire arcuate length of the slit. By being able to compensate for illumination nonuniformities, a considerable improvement in uniformity is realized.

By correcting for the tilt in the trace shown in FIG. 7b so that it assumes the trace shown in FIG. 7c, one is able to maintain a constant value on the meter 98 when adjusting the slit 63 of the compliant member. If such a constant value were not available, obvious difficulty and inaccuracy would be encountered in the control of the exposure of photoresist on the wafer.

What is claimed is:

1. In a method for eliminating the tilt of a trace resulting from plotting the detected energy from a lamp that is imaged along a tapered arcuate slit versus position along the slit, the steps comprising: detecting the light energy at positions along the length of the slit, obtaining a signal representative of the light energy along the length of the slit, providing a taper correction function based upon the position along the slit, and multiplying said intensity signal by said correction factor to produce a signal representative of the exposure uniformity produced by the system and which ideally does not have a linear variation with slit position.

2. The method of claim 1 including monitoring the intensity of light from the lamp and providing means for compensating for intensity variations in the lamp.

3. In a system for correcting for variations of light intensity from an ideal value of a lamp used to illuminate an arcuate slit imaged onto a mask that is supported on a pivoting carriage in a projection mask aligner, the combination comprising: a compliant member having an adjustable slit, means for adjusting said slit, means for detecting the intensity of light at positions along the length of said slit, means connected to the detection means for obtaining a signal representative of the intensity of the light along the length of the slit, means for producing a taper correction function based upon the position along the slit, and means for multiplying said intensity signal by said correction factor to produce a signal that directly indicates the uniformity of exposure obtained with such a system.

4. The system of claim 3 including means for monitoring the intensity of the lamp to obtain a voltage representative of the temporal variation in light intensity of the lamp and means for dividing the uniformity signal by the signal proportional to the instantaneous intensity of the light from the lamp.

5. In a method for correcting for variations of light intensity along a tapered arcuate slit employed in a scanning projection mask aligner, the steps comprising: providing a compliant member having an adjustable slit, detecting the intensity of light at positions along the length of said slit, obtaining a signal representative of the intensity of the light along the length of the slit, providing a taper correction function based upon the position along the slit, multiplying said intensity trace signal by said correction factor to produce a signal that is constant along the slit and adjusting the width of the slit to provide uniform exposure in the slit direction.

6. The method of claim 5 including monitoring the intensity of the lamp to obtain a measure of temporal variation in the intensity of light emitted thereby and dividing the uniformity signal by the lamp output signal.

7. In an apparatus for measuring the illumination uniformity in a ring field projection system comprising:
a tapered slit,
light source means for projecting light through said tapered slit,
detector means disposed in said tapered slit adapted to be moved along the length of said tapered slit,
said detector means comprising light sensor means providing a signal representative of light intensity at the position of said light sensor means in said tapered slit,
said detector means including potentiometer means providing a signal representative of the position of said detector means in said tapered slit,
taper correction means connected to said potentiometer means providing a signal which when multiplied by said signal representative of said light intensity provides a voltage representative of light intensity at various locations along said tapered slit corrected for variations of light intensity with position of said detection means in said tapered slit,
multiplier means connected to said taper correction means and light sensor means providing said voltage as an output,
display means connected to said multiplier means providing a direct indication of light intensity deviation from ideal.

8. In a system according to claim 7 further comprising:
monitoring means providing a signal representative of the intensity of said light source,
divider means connected to said monitoring means and between said multiplier means and said display means to correct for false variations in the display that would otherwise be caused by light source output fluctuations.

* * * * *